(12) United States Patent
Kim

(10) Patent No.: US 11,450,363 B2
(45) Date of Patent: Sep. 20, 2022

(54) MEMORY DEVICE AND OPERATING METHOD THEREOF

(71) Applicant: SK hynix Inc., Icheon-si (KR)

(72) Inventor: Jae Woong Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/314,639

(22) Filed: May 7, 2021

(65) Prior Publication Data
US 2022/0148632 A1 May 12, 2022

(30) Foreign Application Priority Data
Nov. 6, 2020 (KR) .......................... 10-2020-0147712

(51) Int. Cl.
G11C 7/00 (2006.01)
G11C 7/12 (2006.01)
G11C 7/10 (2006.01)
G11C 7/04 (2006.01)

(52) U.S. Cl.
CPC ................. G11C 7/12 (2013.01); G11C 7/04 (2013.01); G11C 7/1048 (2013.01); G11C 7/1069 (2013.01)

(58) Field of Classification Search
CPC .......... G11C 7/12; G11C 7/04; G11C 7/1048; G11C 7/1069

USPC ............................................. 365/203, 185.17
See application file for complete search history.

(56) References Cited

U.S. PATENT DOCUMENTS 9,384,846 B1 * 7/2016 Shim ........................ G11C 7/04

FOREIGN PATENT DOCUMENTS

KR 1020150018389 A 2/2015
KR 101786572 B1 10/2017

* cited by examiner

*Primary Examiner* — Huan Hoang
(74) *Attorney, Agent, or Firm* — William Park & Associates Ltd.

(57) ABSTRACT

The memory device includes a memory cell array including a plurality of memory blocks each including a plurality of strings, wherein the plurality of memory blocks are controlled to have a set temperature; a peripheral circuit for performing a read operation on a selected memory block among the plurality of memory blocks; a temperature detection circuit for detecting a temperature of the memory cell array and generating a temperature detection signal based on the temperature of the memory cell array; and a control logic for controlling the peripheral circuit during the read operation and configured to generate a heating control signal that may control the selected memory block to have the set temperature in response to the temperature detection signal.

20 Claims, 13 Drawing Sheets

MEMORY DEVICE AND OPERATING METHOD THEREOF

CROSS-REFERENCE TO RELATED APPLICATION

The present application claims priority under 35 U.S.C. § 119(a) to Korean patent application number 10-2020-0147712, filed on Nov. 6, 2020, in the Korean Intellectual Property Office, the entire disclosure of which is incorporated herein by reference.

BACKGROUND

1. Technical Field

The present disclosure generally relates to an electronic device, and more particularly, to a memory device and an operating method thereof.

2. Related Art

The paradigm on recent computer environment has been turned into ubiquitous computing environment in which computing systems can be used anywhere and anytime. This promotes increasing usage of portable electronic devices, such as mobile phones, digital cameras, notebook computers, and the like. Such portable electronic devices may generally include a memory system using a memory device, i.e., a data storage device. The data storage device is used as a main memory device or an auxiliary memory device of the portable electronic devices.

A data storage device using a memory device has excellent stability and durability, high information access speed, and low power consumption, since there is no mechanical driving part. In an example of memory systems with such advantages, the data storage device includes a Universal Serial Bus (USB) memory device, memory cards with various interfaces, a Solid State Drive (SSD), and the like.

The memory device is generally classified into a volatile memory device and a nonvolatile memory device.

The nonvolatile memory device has relatively slow write and read speeds, but retains stored data even when the supply of power is interrupted. Thus, the nonvolatile memory device is used to store data to be retained regardless of whether power is supplied. Examples of the nonvolatile memory include a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory is classified into a NOR type flash memory and a NAND type flash memory.

SUMMARY

In accordance with an aspect of the present disclosure, there is provided a memory device including: a memory cell array including a plurality of memory blocks each including a plurality of strings, wherein the plurality of memory blocks are controlled to have a set temperature; a peripheral circuit configured to perform a read operation on a selected memory block among the plurality of memory blocks; a temperature detection circuit configured to detect a temperature of the memory cell array and generate a temperature detection signal based on the temperature of the memory cell array; and a control logic configured to control the peripheral circuit during the read operation and configured to generate a heating control signal that may control the selected memory block to have the set temperature in response to the temperature detection signal.

In accordance with another aspect of the present disclosure, there is provided a memory device including: a memory cell array including a plurality of memory blocks each including a plurality of strings, wherein the plurality of memory blocks are controlled to have a set temperature in response to a bit line voltage; a peripheral circuit configured to perform a read operation on a selected memory block among the plurality of memory blocks; a temperature detection circuit configured to detect a temperature of the memory cell array and generate a temperature detection signal based on the temperature of the memory cell array; and a control logic configured to control the peripheral circuit during the read operation and configured to set a potential or current amount of the bit line voltage to control the selected memory block to have the set temperature in response to the temperature detection signal.

In accordance with still another aspect of the present disclosure, there is provided a method for operating a memory device, the method including: providing a memory cell array including a plurality of memory blocks, each with a heating layer; detecting a temperature of the memory cell array by using a temperature detection circuit that is disposed adjacent to the memory cell array; generating a heating control signal that is applied to the heating layer of a selected memory block among the plurality of memory blocks, based on the detected temperature of the memory cell array; controlling the selected memory block to have a set temperature or higher in response to the heating control signal; and performing a data sensing operation on the selected memory block.

In accordance with still another aspect of the present disclosure, there is provided a method for operating a memory device, the method including: providing a memory cell array including a plurality of memory blocks, each with a heating layer; detecting a temperature of the memory cell array by using a temperature detection circuit that is disposed adjacent to the memory cell array; setting a potential or current amount of a bit line voltage that is applied to bit lines of a selected memory block among the plurality of memory blocks, based on the detected temperature of the memory cell array; controlling the selected memory block to have a set temperature or higher by applying the bit line voltage to the bit lines of the selected memory block in a bit line precharge period; and performing a data sensing operation on the selected memory block.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Hereinafter, exemplary embodiments of the present disclosure will be described in detail with reference to the accompanying drawings in order for those skilled in the art to be able to readily implement the technical spirit of the present disclosure.

It will be understood that although the terms "first", "second", "third" etc. are used herein to describe various dements, these elements should not be limited by these terms. These terms are only used to distinguish one element from another element. Thus, a first dement in some embodiments could be termed a second dement in other embodiments without departing from the teachings of the present disclosure.

Further, it will be understood that when an element is referred to as being "connected" or "coupled" to another element, it can be directly connected or coupled to the other element or intervening elements may be present. In contrast, when an dement is referred to as being "directly connected" or "directly coupled" to another dement, there are no intervening elements present.

Embodiments provide a memory device for constantly maintaining the temperature of a memory block during a read operation of the memory device, and an operation method of the memory device.

Figure 1:
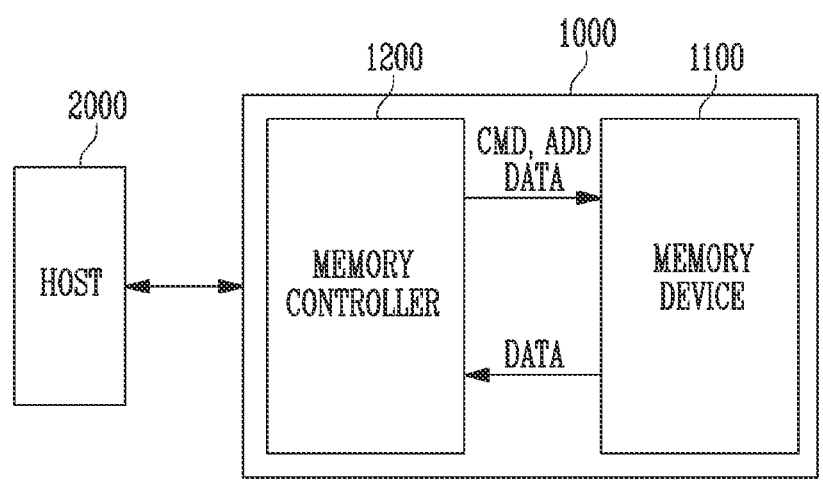
FIG. 1 is a diagram illustrating a memory system in accordance with an embodiment of the present disclosure.

FIG. 1 is a diagram illustrating a memory system in accordance with an embodiment of the present disclosure.

Referring to FIG. 1, the memory system 1000 may include a memory device 1100 configured to store data and a memory controller 1200 configured to control the memory device 1100, which is under the control of a host 2000.

The host 2000 may communicate with the memory system 1000 by using an interface protocol, such as Peripheral Component Interconnect-Express (PCI-E), Advanced Technology Attachment (ATA), Serial ATA (SATA), Parallel ATA (PATA), or Serial Attached SCSI (SAS). In addition, the interface protocol between the host 2000 and the memory system 1000 are not limited to the above-described example, and may be one of other interface protocols, such as a Universal Serial Bus (USB), a Multi-Media Card (MMC), an Enhanced Small Disk Interface (ESDI), and an Integrated Drive Electronics (IDE).

The memory controller 1200 may control overall operations of the memory system 1000, and control data exchange between the host 2000 and the memory device 1100. For example, the memory controller 1200 may control the memory device 1100 to program or read data according to a request of the host 2000. In a program operation, the memory controller 1200 may transmit, to the memory device 1100, a command CMD that corresponds to the program operation, an address ADD, and data DATA to be programmed. Also, during a read operation, the memory controller 1200 may receive and temporarily store data DATA that is read from the memory device 1100 and may transmit the temporarily stored data DATA to the host 2000.

The memory device 1100 may perform a program, read, or erase operation, which is under the control of the memory controller 1200. The memory device 1100 may detect the temperature of a memory cell array during a read operation and may control the temperature of a selected memory block to match the set temperature. Accordingly, the memory device 1100 may perform the read operation in a state in which the selected memory block is maintained at a constant temperature, so that the reliability of the read operation can be improved.

In some embodiments, the memory device 1100 may include a Double Data Rate Synchronous Dynamic Random Access Memory (DDR SDRAM), a Low Power Double Data Rate4 (LPDDR4) SDRAM, a Graphics Double Data Rate (DDDR) SDRAM, a Low Power DDR (LPDDR), a Rambus Dynamic Random Access Memory (RDRAM), or a flash memory.

Figure 2:
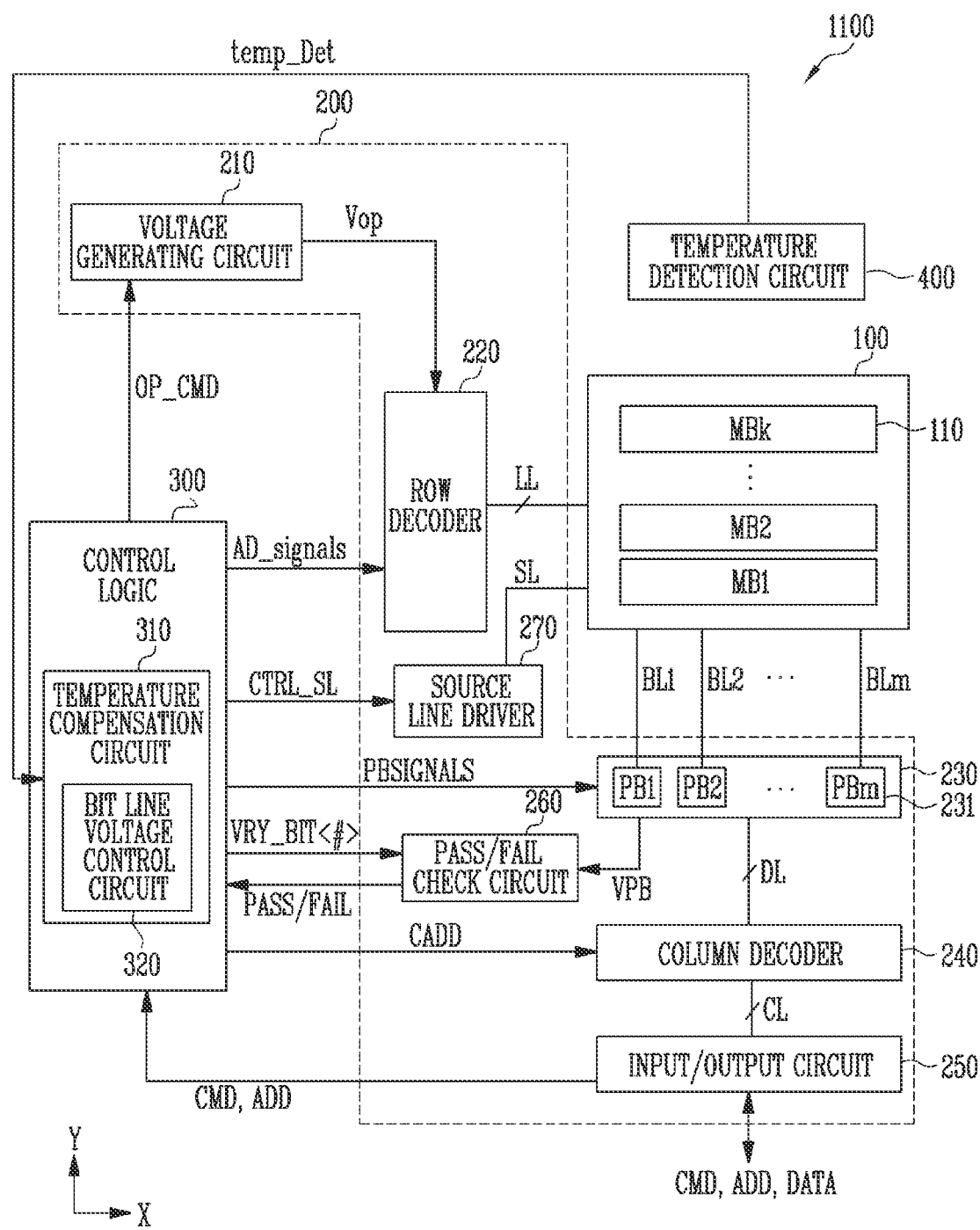
FIG. 2 is a diagram illustrating a first embodiment of a memory device shown in FIG. 1.

FIG. 2 is a diagram illustrating a first embodiment of the memory device shown in FIG. 1.

Referring to FIG. 2, the memory device 1100 may include a memory cell array 100 in which data is stored. The memory device 1100 may include a peripheral circuit 200 configured to perform a program operation for storing data in the memory cell array 100, a read operation for outputting stored data, and an erase operation for erasing stored data. The memory device 1100 may include a control logic 300 that controls the peripheral circuit 200, which is under the control of the memory controller (1200 shown in FIG. 1). The memory device 1100 may include a temperature detection circuit 400 for detecting a temperature of the memory cell array 100, and the control logic 300 may control the temperature of a selected memory block to match the set temperature during a read operation, based on the temperature of the memory cell array 100, which is detected by the temperature detection circuit 400.

The memory cell array 100 may include a plurality of memory blocks MB1 to MBk 110 (k is a positive integer), Local lines LL and bit lines BL1 to BLm (m is a positive integer) may be connected to each of the memory blocks MB1 to MBk 110. For example, the local lines LL may include a first select line, a second select line, and a plurality of word lines that are arranged between the first and second select lines. Also, the local lines LL may include dummy lines that are arranged between the first select line and the word lines and between the second select line and the word lines. The first select line may be a source select line, and the second select line may be a drain select line. For example, the local lines LL may include word lines, drain and source select lines, and source lines SL. For example, the local lines LL may further include dummy lines. For example, the local lines LL may further include pipe lines. The local lines LL may be connected to each of the memory blocks MB1 to MBk 110, and the bit lines BL1 to BLm may be commonly connected to the memory blocks MB1 to MBk 110. The memory blocks MB1 to MBk 110 may be implemented in a two-dimensional or three-dimensional structure. For example, memory cells may be arranged in a direction parallel to a substrate in the memory blocks 110 with the two-dimensional structure. For example, memory cells may be stacked in a direction vertical to a substrate in the memory blocks 110 with the three-dimensional structure. A temperature of each of the memory blocks 110 may be adjusted according to the potential or current amount of a bit line voltage, which is applied to the bit lines BL1 to BLm.

The peripheral circuit 200 may be configured to perform program, read, and erase operations of a selected memory block 110, which is under the control of the control logic 300. For example, the peripheral circuit 200 may include a voltage generating circuit 210, a row decoder 220, a page buffer group 230, a column decoder 240, an input/output circuit 250, a pass/fail check circuit 260, and a source line driver 270.

The voltage generating circuit 210 may generate various operating voltages Vop used for program, read, and erase operations in response to an operation signal OP_CMD.

The row decoder 220 may transfer the operating voltages Vop to the local lines LL connected to the selected memory block 110 in response to row decoder control signals AD_signals. For example, in a program operation, the row decoder 220 may apply a program operation voltage that is generated by the voltage generating circuit 210 to word lines of a selected memory block in response to the row decoder control signals AD_signals. Also, during a read operation, the row decoder 220 may apply a read operation voltage that is generated by the voltage generating circuit 210 to word lines of a selected memory block in response to the row decoder control signals AD_signals.

The page buffer group 230 may include a plurality of page buffers PB1 to PBm 231 that are connected to the bit lines BL1 to Bm. The page buffers PB1 to PBm 231 may operate in response to page buffer control signals PBSIGNALS. For example, in a program operation, the page buffers PB1 to PBm 231 may temporarily store data to be programmed and control the potential level of the bit lines BL1 to BLm based on the temporarily stored data to be programmed.

In an embodiment, the page buffers PB1 to PBm 231 may control the temperature of a selected memory block (e.g., MB1) among the memory blocks MB1 to MBk 110 that are included in the memory cell array 100 to match the set temperature by adjusting the potential or current amount of the bit line voltage that is applied to the bit lines BL1 to BLm in a temperature compensation period during a read operation. Also, the page buffers PB1 to PBm 231 may sense data that is stored in memory cells that are included in the selected memory block (e.g., MB1), based on the potential or current amount of the bit lines BL1 to BLm, in a data sensing period after the temperature compensation period.

In another embodiment, the page buffers PB1 to PBm 231 may control the temperature of a selected memory block (e.g., MB1) among the memory blocks MB1 to MBk 110 that are included in the memory cell array 100 to match the set temperature by adjusting the potential or current amount of the bit line voltage that is applied to the bit lines BL1 to BLm in a precharge period of the bit lines BL1 to BLm during a read operation. Also, the page buffers PB1 to PBm 231 may sense data that is stored in memory cells that are included in the selected memory block (e.g., MB1), based on the potential or current amount of the bit lines BL1 to BLm, in a data sensing period after the precharge period of the bit lines BL1 to BLm.

The column decoder 240 may transfer data between the input/output circuit 250 and the page buffer group 230 in response to a column address CADD. For example, the column decoder 240 may exchange data with the page buffers 231 through the data lines DL, or exchange data with the input/output circuit 250 through column lines CL.

The input/output circuit 250 may transfer a command CMD and an address ADD, which are transferred from the memory controller (1200 shown in FIG. 1) to the control logic 300, or exchange data DATA with the column decoder 240.

During a read operation or a program verify operation, the pass/fail check circuit 260 may generate a reference current in response to an allow bit VRY_BIT<#>, and output a pass signal PASS or a fail signal FAIL by comparing a sensing voltage VPB received from the page buffer group 230 with a reference voltage that is generated by the reference current. The sensing voltage VPB may be a voltage controlled based on a number of memory cells determined as pass in the program verify operation.

The source line driver 270 may be connected to a memory cell that is included in the memory cell array 100 through a source line SL and may control the voltage that is applied to the source line SL. The source line driver 270 may receive a source line control signal CTRL_SL from the control logic 300 and may control a source line voltage that is applied to the source line SL, based on the source line control signal CTRL_SL.

The control logic 300 may control the peripheral circuit 200 by outputting the operation signal OP_CMD, the row decoder control signals AD_signals, the page buffer control signals PBSIGNALS, and the allow bit VRY_BIT<#> in response to a command CMD and an address ADD.

The control logic 300 may include a temperature compensation circuit 310. The temperature compensation circuit 310 may receive a temperature detection signal temp_Det from the temperature detection circuit 400 during a read operation and may adjust the bit line voltage that is applied to the bit lines BL1 to BLm in the temperature compensation period or the potential or current amount of the bit line voltage that is applied to the bit lines BL1 to BLm in the precharge period of the bit lines BL1 to BLm in response to the received temperature detection signal temp_Det.

The temperature compensation circuit 310 may include a bit line voltage control circuit 320, and the bit line voltage control circuit 320 may adjust the potential or current amount of the bit line voltage in response to the temperature detection signal temp_Det.

During a read operation, the temperature detection circuit 400 may detect the temperature of the memory cell array 100, generate a temperature detection signal temp_Det, and output the temperature detection signal temp_Det to the control logic 300. The temperature detection circuit 400 may be disposed to be physically adjacent to the memory cell array 100. For example, the temperature detection circuit 400 may be disposed at a side or an upper/lower side of the memory cell array 100, or be disposed within the memory cell array 100.

Figure 3:
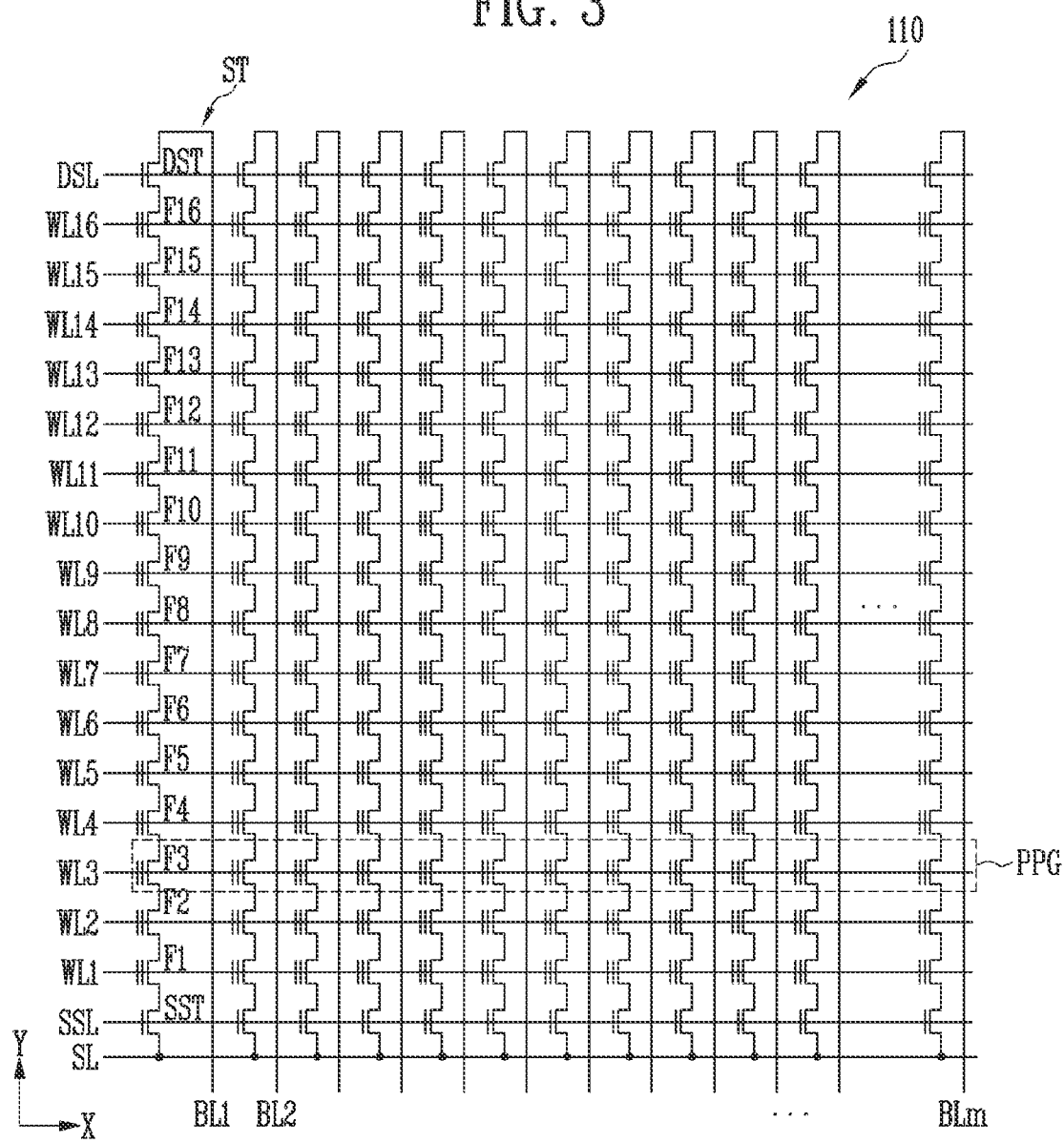
FIG. 3 is a diagram illustrating a memory block shown in FIG. 2.

FIG. 3 is a diagram illustrating the memory block shown in FIG. 2.

Referring to FIG. 3, in the memory block 110, a plurality of word lines that are arranged in parallel to one another may be connected between a first select line and a second select line. The first select line may be a source select line SSL, and the second select line may be a drain select line DSL. More specifically, the memory block 110 may include a plurality of strings ST that is connected between bit lines BL1 to BLm and a source line SL. The bit lines BL1 to BLm may be connected to the strings ST, respectively, and the source line SL may be commonly connected to the strings ST. The strings ST may be configured identically to one another, and therefore, a string ST that is connected to a first bit line BL1 will be described in detail as an example.

The string ST may include a source select transistor SST, a plurality of memory cells F1 to F16, and a drain select transistor DST, which are connected in series between the source line SL and the first bit line BL1. At least one source select transistor SST and at least one drain select transistor DST may be included in one string ST, and memory cells of which number is greater than that of the memory cells F1 to F16 that are shown in the drawing may be included in the one string ST.

A source of the source select transistor SST may be connected to the source line SL, and a drain of the drain select transistor DST may be connected to the first bit line BL1. The memory cells F1 to F16 may be connected in series between the source select transistor SST and the drain select transistor DST. Gates of source select transistors SST that are included in different strings ST may be connected to the source select line SSL, gates of drain select transistors DST that are included in different strings ST may be connected to the drain select line DSL, and gates of memory cells F1 to F16 that are included in different strings ST may be connected to a plurality of word lines WL1 to WL16. A group of memory cells that is connected to the same word line among memory cells that are included in different strings ST may be referred as a page PPG. Therefore, pages PPG of which number corresponds to that of the word lines WL1 to WL16 may be included in the memory block 110.

Figure 4:
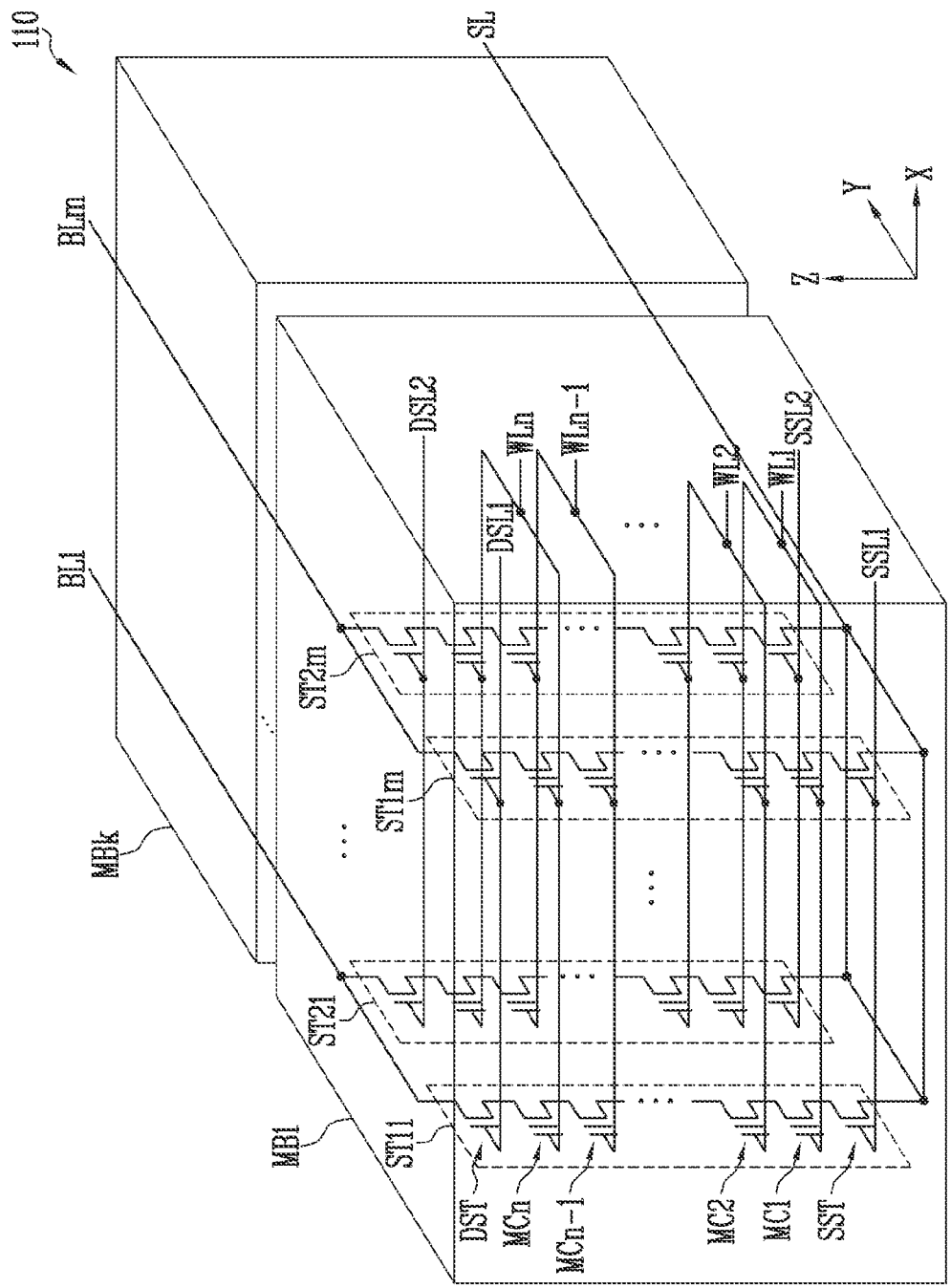
FIG. 4 is a diagram illustrating an embodiment of a three-dimensionally configured memory block.

FIG. 4 is a diagram illustrating an embodiment of a three-dimensionally configured memory block.

Referring to FIG. 4, the memory cell array 100 may include a plurality of memory blocks MB1 to MBk 110. The memory block 110 may include a plurality of strings ST11 to ST1*m* and ST21 to ST2*m*. In an embodiment, each of the plurality of strings ST11 to ST1*m* and ST21 to ST2*m* may be formed in an shape or a shape. In a first memory block MB1, m strings may be arranged in a row direction (X direction). Although the case in which two strings are arranged in a column direction (Y direction) is illustrated in FIG. 4, this is for convenience of description, and three or more strings may be arranged in the column direction (V direction).

Each of the plurality of strings ST11 to ST1*m* and ST21 to ST2*m* may include at least one source select transistor SST, first to nth memory cells MC1 to MCn, and at least one drain select transistor DST.

The source select transistor SST of each string may be connected between a source line SL and memory cells MC1 to MCn. Source select transistors of strings that are arranged on the same row may be connected to the same source select line. Source select transistors of strings ST11 to ST1*m* that are arranged on a first row may be connected to a first source select line SSL1, Source select transistors of strings ST21 to ST2*m* that are arranged on a second row may be connected to a second source select line SSL2. In another embodiment, the source select transistors of the strings ST11 to ST1*m* and ST21 to ST2*m* may be commonly connected to one source select line.

The first to nth memory cells MC1 to MCn of each string may be connected in series to each other between the source select transistor SST and the drain select transistor DST. Gates of the first to nth memory cells MC1 to MCn may be respectively connected to first to nth word lines WU to WLn.

In an embodiment, at least one of the first to nth memory cells MC1 to MCn may be used as a dummy memory cell. When the dummy memory cell is provided, a voltage or current of a corresponding string can be stably controlled. Accordingly, the reliability of data that is stored in the memory block 110 can be improved.

The drain select transistor DST of each string may be connected between a bit line and the memory cells MC1 to MCn. Drain select transistors DST of strings that are arranged in the row direction may be connected to a drain select line that extends in the row direction. Drain select transistors DST of the strings ST11 to ST1*m* on the first row may be connected to a first drain select line DSL1. Drain select transistors DST of the strings ST21 to ST2*m* on the second row may be connected to a second drain select line DSL2.

Figure 5:
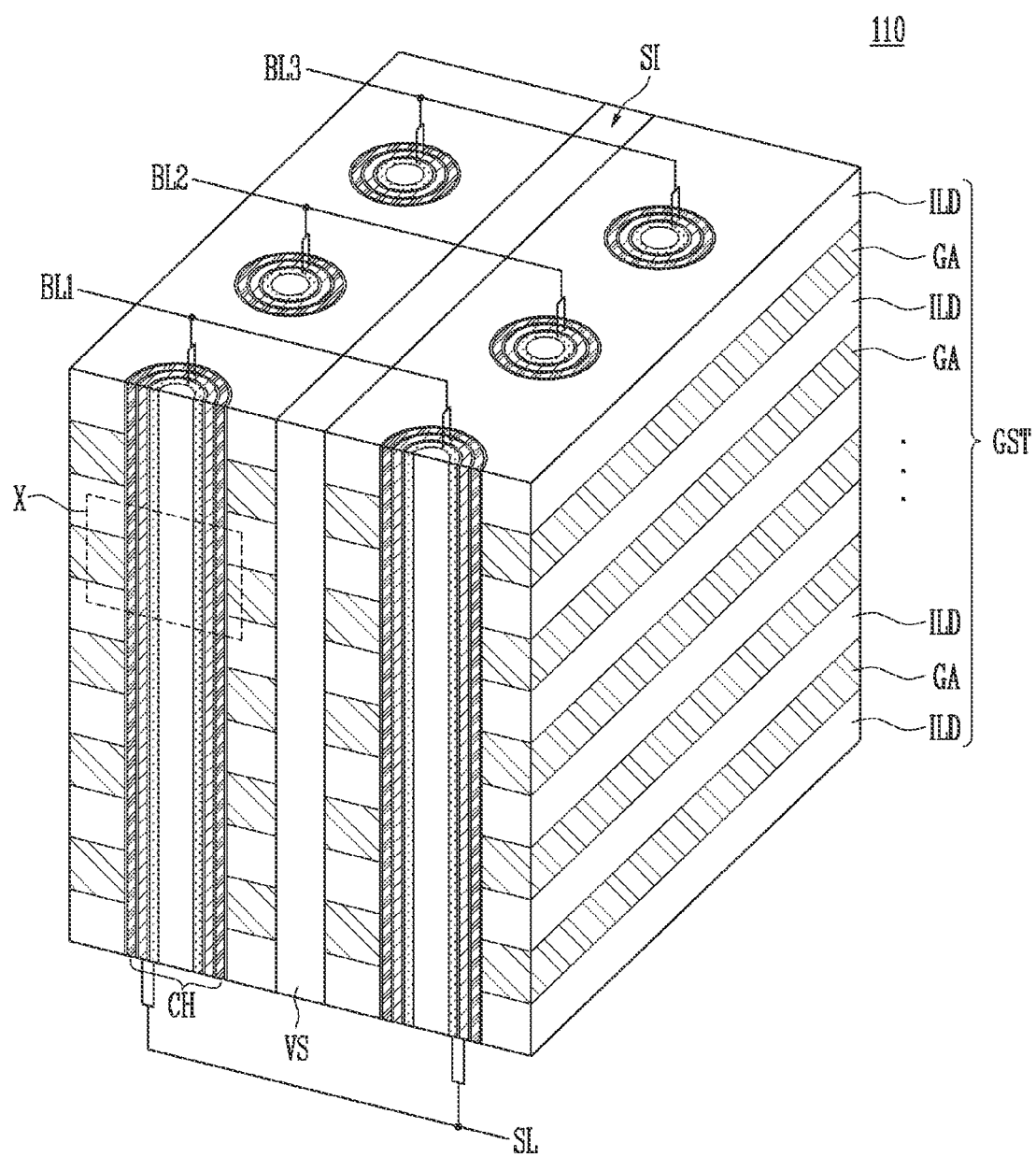
FIG. 5 is a perspective view illustrating an internal structure of strings included in the memory block shown in FIG. 2.

FIG. 5 is a perspective view illustrating an internal structure of strings included in the memory block shown in FIG. 2.

Referring to FIG. 5, the memory block 110 may include gate stack structures GST that are isolated from each other by a slit SI and channel structures CH that penetrate each of the gate stack structure GST.

The slit SI may be filled with a vertical structure VS. In an embodiment, the vertical structure VS may include an insulating material.

Each of the gate stack structures GST may include interlayer insulating layers ILD and gate electrodes GA, which are alternately stacked in one direction. The gate electrodes GA may correspond to the drain select line DSL1 or DSL2, the plurality of word lines WL1 to WLn, and the source select line SSL1 or SSL2, which are shown in FIG. 4.

Hereinafter, the direction in which the interlayer insulating layers ILD and the gate electrodes GA are alternately stacked is referred to as a stacking direction.

Each of the channel structures CH may correspond to any one of the plurality of strings ST11 to ST1*m* and ST21 to ST2*m* shown in FIG. 4. The channel structure CH may extend in the stacking direction and may be surrounded by the gate electrodes GA.

Each of the channel structures CH may be connected to a plurality of bit lines BL1 to BL3 and a source line SL. For example, each of the channel structures CH may include a channel layer and a heating layer, which extend vertically, and the channel layer and the heating layer may be connected to the plurality of bit lines BL1 to BL3 and the source line SL.

Figure 6:
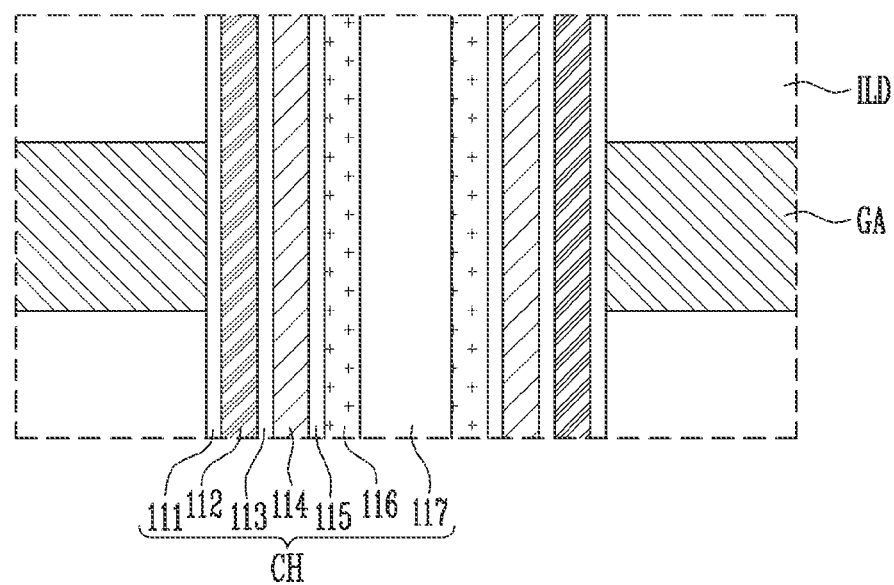
FIG. 6 is an enlarged sectional view of region X shown in FIG. 5.

FIG. 6 is an enlarged sectional view of region X shown in FIG. 5.

Referring to FIG. 6, the channel structure CH may include a blocking insulating layer 111, a charge storage layer 112, a tunnel insulating layer 113, a channel layer 114, an insulating layer 115, a heating layer 116, and a core insulating layer 117, which extend in a vertical direction.

The blocking insulating layer 111 may surround a sidewall of the charge storage layer 112. The blocking insulating layer 111 may include an oxide layer that is capable of blocking charges.

The charge storage layer 112 may surround a sidewall of the tunnel insulating layer 113. The charge storage layer 112 may be formed as a material layer that is capable of storing data that is changed by using Fowler-Nordheim tunneling. In an embodiment, the charge storage layer may be formed as a charge trap nitride layer.

The tunnel insulating layer 113 may surround a sidewall of the channel layer 114. The tunnel insulating layer 113 may be formed as a silicon oxide layer through which charges can tunnel.

The channel layer 114 may surround a sidewall of the insulating layer 115. The channel layer 114 may be used as a channel region of a string. The channel layer 112 may include a semiconductor layer. In an embodiment, the channel layer 121 may include silicon.

The insulating layer 115 may surround the heating layer 116, The insulating layer 115 may be disposed between interfaces of the channel layers 114 and the heating layer 116 to electrically isolate the channel layer 114 and the heating layer 116 from each other.

The heating layer 116 may surround the core insulating layer 117. The heating layer 116 may be electrically connected to the bit line and the source line as shown in FIG. 5. The heating layer 116 may apply heat to the channel structure CH based on the potential or current amount of the bit line voltage that is applied to the bit lines in a temperature compensation period or a bit line precharge period during the read operation.

The heating layer 116 may be formed as a thermal resistance layer with high resistivity, such as a metal alloy (e.g., Ni—Cr or Fe—Cr) layer, a doped silicon layer, a doped germanium layer, or a doped carbon layer.

Figure 7:
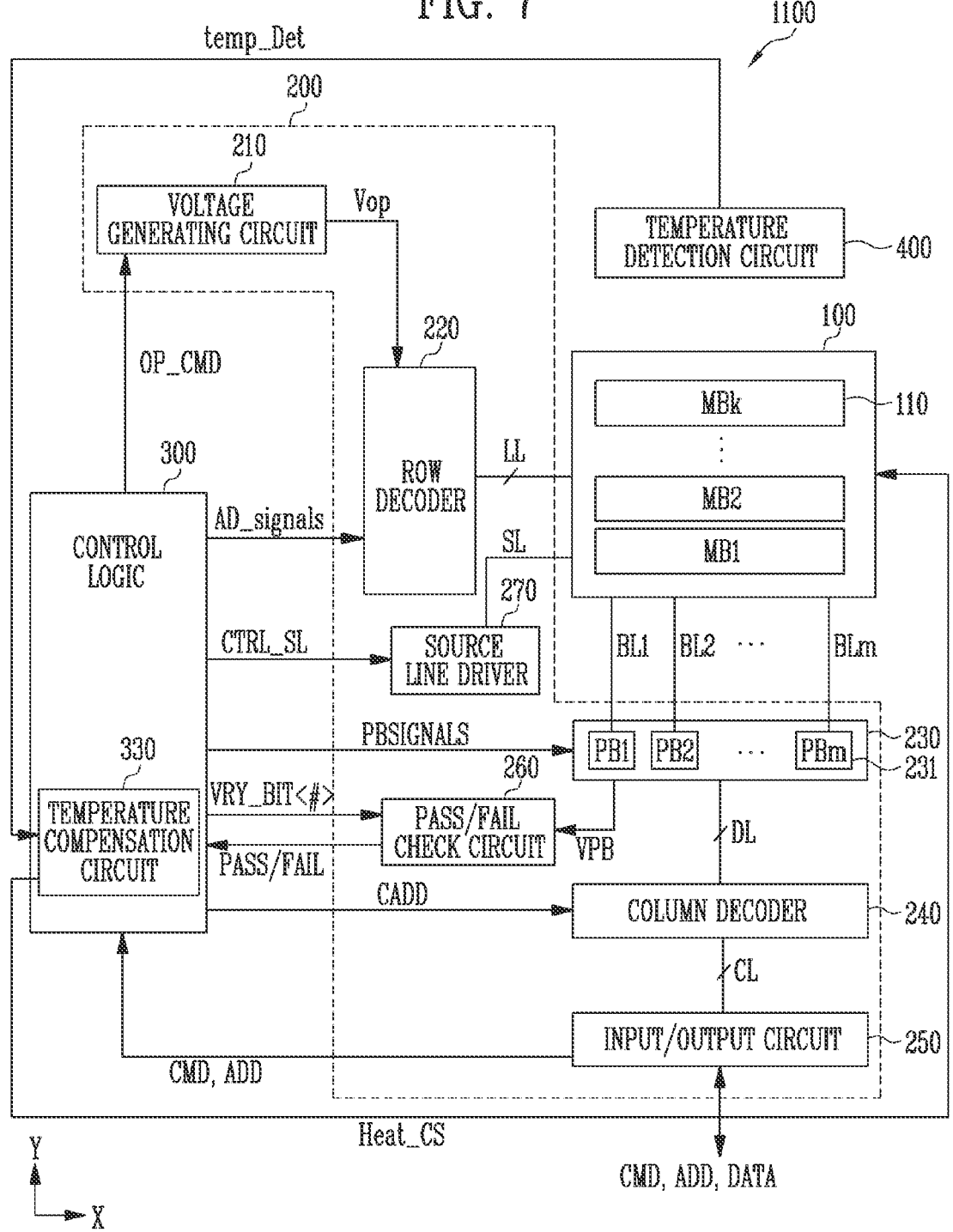
FIG. 7 is a diagram illustrating a second embodiment of the memory device shown in FIG. 1.

FIG. 7 is a diagram illustrating a second embodiment of the memory device shown in FIG. 1.

Referring to FIG. 7, the memory device 1100 may include a memory cell array 100 in which data is stored. The memory cell array 100 may adjust a temperature by applying heat to a selected memory block in response to a heating control signal Heat_CS. The memory device 1100 may include a peripheral circuit 200 configured to perform a program operation for storing data in the memory cell array 100, a read operation for outputting stored data, and an erase operation for erasing stored data. The memory device 1100 may include a control logic 300 that controls the peripheral circuit 200, which is under the control of the memory controller (1200 shown in FIG. 1). The memory device 1100 may include a temperature detection circuit 400 for detecting a temperature of the memory cell array 100, and the control logic 300 may generate and output the heating control signal Heat_CS that may control the temperature of the selected memory block during a read operation based on the temperature of the memory cell array 100, which is detected by the temperature detection circuit 400.

The memory cell array 100 may include a plurality of memory blocks MB1 to MBk 110 (k is a positive integer). Local lines LL and bit lines BL1 to BLm (m is a positive integer) may be connected to each of the memory blocks MB1 to MBk 110. For example, the local lines LL may include a first select line, a second select line, and a plurality of word lines that are arranged between the first and second select lines. Also, the local lines LL may include dummy lines that are arranged between the first select line and the word lines and between the second select line and the word lines. The first select line may be a source select line, and the second select line may be a drain select line. For example, the local lines LL may include word lines, drain and source select lines, and source lines SL. For example, the local lines LL may further include dummy lines. For example, the local lines LL may further include pipe is lines. The local lines LL may be connected to each of the memory blocks MB1 to MBk 110, and the bit lines BL1 to BLm may be commonly connected to the memory blocks MB1 to MBk 110. The memory blocks MB1 to MBk 110 may be implemented in a two-dimensional or three-dimensional structure. For example, memory cells may be arranged in a direction parallel to a substrate in the memory blocks 110 with the two-dimensional structure. For example, memory cells may be stacked in a direction vertical to a substrate in the memory blocks 110 with the three-dimensional structure. Each of the memory blocks 110 may include heating layers from which heat is generated in response to the heating control signal Heat_CS. The heating layer will be described in detail later with reference to FIGS. 8, 9A, and 9B.

The peripheral circuit 200 may be configured to perform program, read, and erase operations of a selected memory block 110, which is under the control of the control logic 300. For example, the peripheral circuit 200 may include a voltage generating circuit 210, a row decoder 220, a page buffer group 230, a column decoder 240, an input/output circuit 250, a pass/fail check circuit 260, and a source line driver 270.

The voltage generating circuit 210 may generate various operating voltages Vop that are used for program, read, and erase operations in response to an operation signal OP_CMD.

The row decoder 220 may transfer the operating voltages Vop to the local lines LL that are connected to the selected memory block 110 in response to row decoder control signals AD_signals. For example, in a program operation, the row decoder 220 may apply a program operation voltage that is generated by the voltage generating circuit 210 to word lines of a selected memory block in response to the row decoder control signals AD_signals. Also, during a read operation, the row decoder 220 may apply a read operation voltage that is generated by the voltage generating circuit 210 to word lines of a selected memory block in response to the row decoder control signals AD_signals.

The page buffer group 230 may include a plurality of page buffers PB1 to PBm 231 that are connected to the bit lines BL1 to BLm, The page buffers PB1 to PBm 231 may operate in response to page buffer control signals PBSIGNALS. For example, in a program operation, the page buffers PB1 to PBm 231 may temporarily store data to be programmed and may control the potential level of the bit lines BL1 to BLm based on the temporarily stored data to be programmed. During a read operation, the page buffers PB1 to PBm 231 may sense data that is stored in memory cells that are included in a selected memory block (e.g., MB1) based on the potential or current amount of the bit lines BL1 to BLm.

The column decoder 240 may transfer data between the input/output circuit 250 and the page buffer group 230 in response to a column address CADD. For example, the column decoder 240 may exchange data with the page buffers 231 through the data lines DL or exchange data with the input/output circuit 250 through column lines CL.

The input/output circuit 250 may transfer a command CMD and an address ADD, which are transferred from the memory controller (1200 shown in FIG. 1) to the control logic 300, or exchange data DATA with the column decoder 240.

During a read operation or a program verify operation, the pass/fail check circuit 260 may generate a reference current in response to an allow bit VRY_BIT<#> and may output a pass signal PASS or a fail signal FAIL by comparing a sensing voltage VPB that is received from the page buffer group 230 with a reference voltage that is generated by the reference current. The sensing voltage VPB may be a voltage that is controlled based on a number of memory cells determined as pass in the program verify operation.

The source line driver 270 may be connected to a memory cell that is included in the memory cell array 100 through a source line SL and may control a voltage that is applied to the source line SL. The source line driver 270 may receive a source line control signal CTRL_SL from the control logic 300 and may control a source line voltage that is applied to the source line SL based on the source line control signal CTRL_SL.

The control logic 300 may control the peripheral circuit 200 by outputting the operation signal OP_CMD, the row decoder control signals AD_signals, the page buffer control signals PBSIGNALS, and the allow bit VRY_BIT<#> in response to a command CMD and an address ADD.

The control logic 300 may include a temperature compensation circuit 330. The temperature compensation circuit 330 may receive a temperature detection signal temp_Det from the temperature detection circuit 400 during a read operation and may generate and output the heating control signal Heat_CS that is applied to the memory cell array 100 in a temperature compensation period in response to the received temperature detection signal temp_Det. For example, based on the temperature detection signal temp_Det, the control logic 300 may generate the heating control signal Heat_CS by relatively increasing the potential or current amount of the heating control signal Heat_CS when the temperature of the memory cell array 100 is relatively low and may generate the heating control signal Heat_CS by relatively decreasing the potential or current amount of the heating control signal Heat_CS when the temperature of the memory cell array 100 is relatively high.

During a read operation, the temperature detection circuit 400 may detect the temperature of the memory cell array 100, generate a temperature detection signal temp_Det, and output the temperature detection signal temp_Det to the control logic 300. The temperature detection circuit 400 may be disposed physically adjacent to the memory cell array 100. For example, the temperature detection circuit 400 may be disposed at a side or an upper/lower side of the memory cell array 100 or be disposed within the memory cell array 100.

Figure 8:
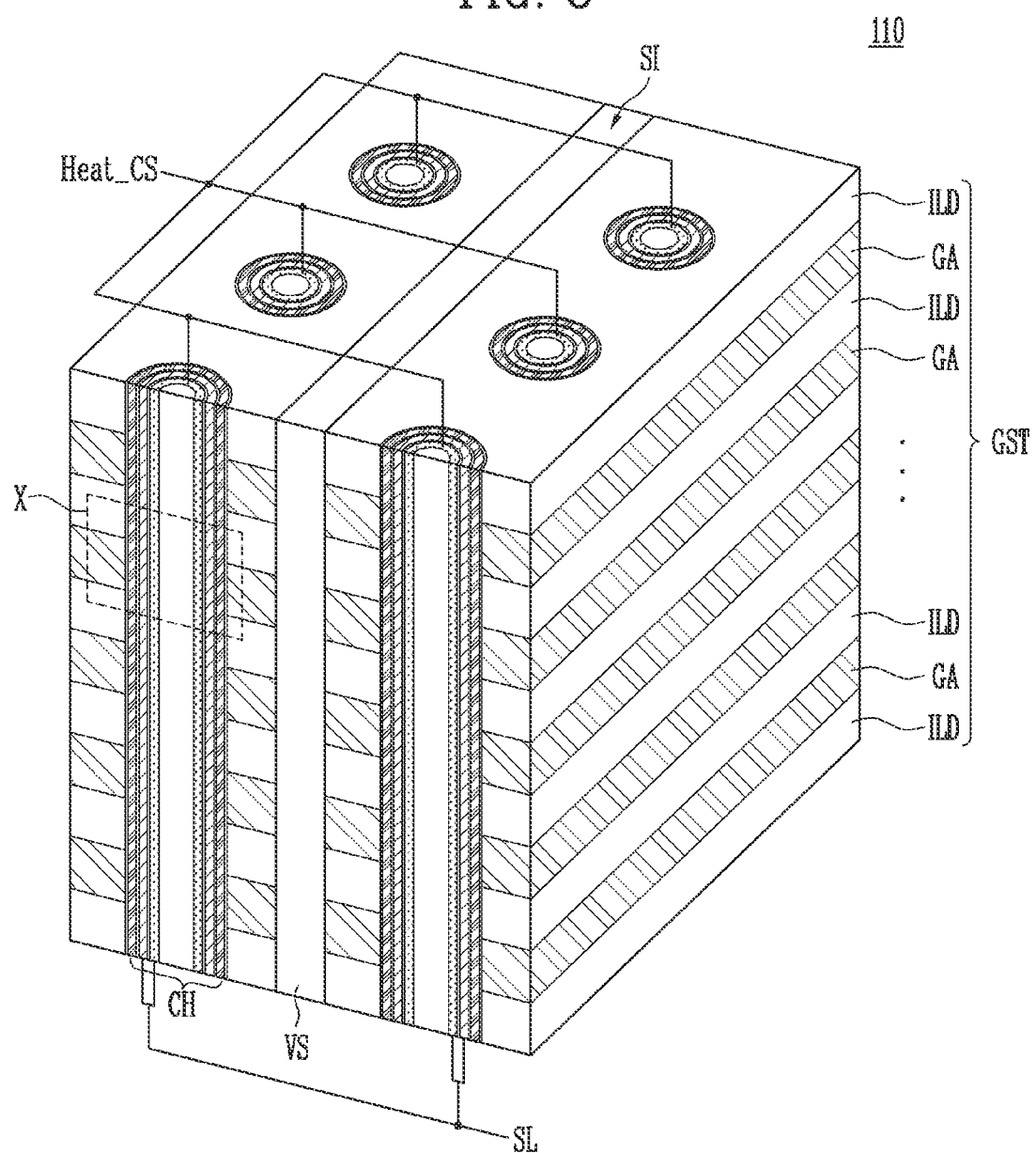
FIG. 8 is a perspective view illustrating an internal structure of strings included in a memory block shown in FIG. 7.

FIG. 8 is a perspective view illustrating an internal structure of strings included in the memory block shown in FIG. 7.

The internal structure of the strings, shown in FIG. 8, is configured similarly to that of the above-described strings shown in FIG. 5, and a heating layer may be connected to the heating control signal Heat_CS, unlike FIG. 5.

That is, while the heating layer shown in FIG. 5 is connected to the plurality of bit line BL1 to BL3 and the source line SL, the heating layer; shown in FIG. 8, may be connected to the heating control signal Heat_CS and the source line SL.

The heating layer may be formed as a thermal resistance layer with high resistivity, such as a metal alloy (e.g. Ni—Cr or Fe—Cr) layer, a doped silicon layer, a doped germanium layer, or a doped carbon layer.

Region X shown in FIG. 8 may be configured in the same structure as the above-described region X shown in FIG. 6.

Figure 9A:
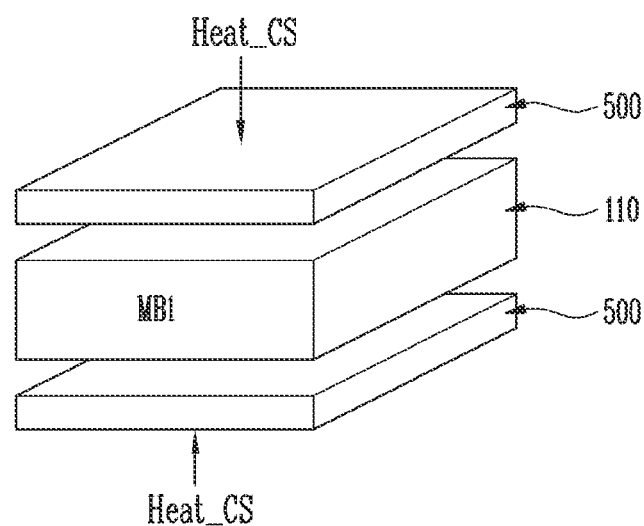
FIG. 9A is a perspective view illustrating another embodiment of a memory cell array shown in FIG. 7.

FIG. 9A is a perspective view illustrating another embodiment of the maemory cell array shown in FIG. 7.

The plurality of memory blocks MB1 to MBk that are included in the memory cell array, shown in FIG. 7, may be configured in the same structure. In the embodiment of the present disclosure, for convenience of description, one memory block MB1 will be described as an example.

Referring to FIG. 9A, a heating layer 500 may be disposed on the top and the bottom of the one memory block MB1 that is included in the memory cell array. The heating layer 500 may generate heat in response to the heating control signal Heat_CS, and accordingly, the temperature of the memory block MB1 may be adjusted. For example, the heating layer 500 may adjust the temperature of the memory block MB1 based on the potential or current amount of the heating control signal Heat_CS. In the embodiment of the present disclosure, the case in which the heating layer 500 is disposed on the top or the bottom of the memory block MB1 has been described as an example. However, the heating layer 500 may be disposed on only the top or the bottom of the memory block MB1.

The heating layer may be formed as a thermal resistance layer with high resistivity, such as a metal alloy (e.g., Ni—Cr or Fe—Cr) layer, a doped silicon layer, a doped germanium layer, or a doped carbon layer.

Figure 9B:
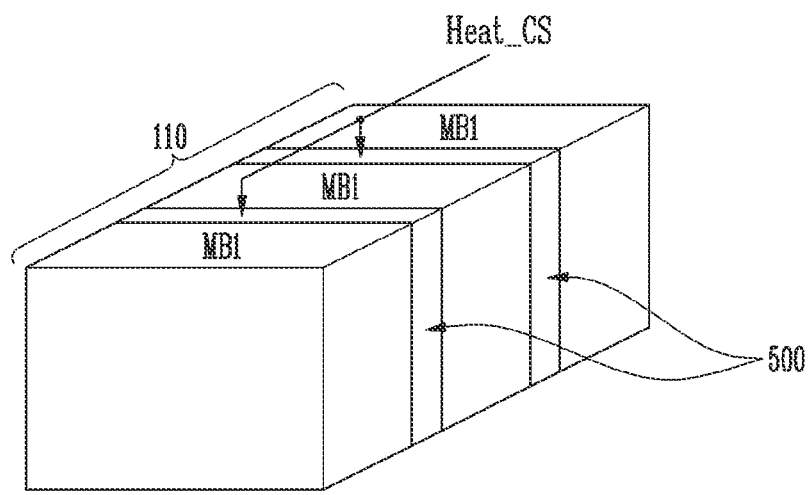
FIG. 9B is a perspective view illustrating still another embodiment of the memory cell array shown in FIG. 7.

FIG. 9B is a perspective view illustrating still another embodiment of the memory cell array shown in FIG. 7.

The plurality of memory blocks MB1 to MBk that are included in the memory cell array, shown in FIG. 7, may be configured in the same structure. In the embodiment of the present disclosure, for convenience of description, one memory block MB1 will be described as an example.

Referring to FIG. 9B, at least one heating layer 500 may be disposed within the one memory block MB1. For example, the one memory block MB1 may be divided into at least two regions, and the heating layer 500 may be disposed in each space between the regions. The heating layer 500 may generate heat in response to the heating control signal Heat_CS, and accordingly, the temperature of the memory block MB1 may be adjusted. For example, the heating layer 500 may adjust the temperature of the memory block MB based on the potential or current amount of the heating control signal Heat_CS.

The heating layer may be formed as a thermal resistance layer with high resistivity, such as a metal alloy (e.g., Ni—Cr or Fe—Cr) layer, a doped silicon layer, a doped germanium layer, or a doped carbon layer.

Figure 10:
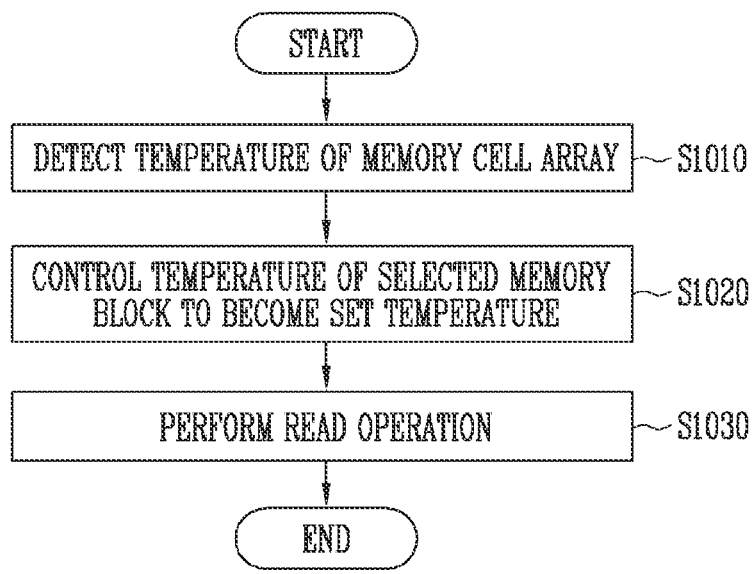
FIG. 10 is a flowchart illustrating an embodiment of a read operation method of the memory devices shown in FIGS. 2 and 7.

FIG. 10 is a flowchart illustrating an embodiment of a read operation method of the memory devices shown in FIGS. 2 and 7.

In step S1010, the temperature detection circuit 400 may generate a temperature detection signal temp_Det by detecting a temperature of the memory cell array 100 during a read operation and may output the temperature detection signal temp_Det to the control logic 300.

In step S1020, the control logic 300 may receive the temperature detection signal temp_Det from the temperature detection circuit 400 and may control the temperature of a selected memory block to match the set temperature in a temperature compensation period in response to the received temperature detection signal temp_Det.

For example, the temperature compensation circuit 310, shown in FIG. 2, may receive the temperature detection signal temp_Det from the temperature detection circuit 400 and may adjust and output the potential or current amount of a bit line voltage that is applied to the bit lines BL1 to BLm in the temperature compensation period in response to the received temperature detection signal temp_Det. For example, when it is determined that the temperature of the memory cell array 100 is relatively low, based on the temperature detection signal temp_Det from the temperature detection circuit 400, the bit line voltage control circuit 320 of the temperature compensation circuit 310 may set the temperature by increasing the potential or current amount of the bit line voltage that is applied to the bit lines BL1 to BLm in the temperature compensation period. The page buffers PB1 to PBm 231 may control the temperature of the selected memory block (e.g., MB1) among the memory blocks MB1 to MBk 110 that are included in the memory cell array 110 to match the set temperature by adjusting the potential or current amount of the bit line voltage that is applied to the bit lines BL1 to BLm in the temperature compensation period.

For example, the temperature compensation circuit 330, shown in FIG. 7, may receive the temperature detection signal temp_Det from the temperature detection circuit 400 and may generate and output a heating control signal Heat_CS that is applied to the memory cell array 100 in the temperature compensation period in response to the received temperature detection signal temp_Det. The temperature of the selected memory block (e.g., MB1) of the memory cell array 110 may be controlled to match the set temperature in response to the heating control signal Heat_CS.

In an embodiment, in the selected memory block 110 shown in FIG. 8, the heating layer that is included in the channel structure CH of the strings may generate heat in response to the heating control signal Heat_CS, and accordingly, the temperature of the selected memory block 110 may be controlled to match the set temperature.

In another embodiment, in the selected memory block MB1, shown in FIG. 9A or 9B, the heating layer 500 that is disposed on the top and the bottom of the selected memory block MB1 or within the selected memory block MB1 may generate heat in response to the heating control signal Heat_CS, and accordingly, the temperature of the selected memory block 110 may be controlled to match the set temperature.

In step S1030, the peripheral circuit 200 may perform the read operation on the selected memory block MB1 in a data sensing period after the temperature compensation period. For example, the voltage generating circuit 210 may generate and output a read voltage, and the row decoder 220 may apply the read voltage that is generated by the voltage generating circuit 210 to a selected word line of the selected memory block MB1. The page buffers PB1 to PBm 231 precharge the bit lines BL1 to BLm to a certain level and then perform the read operation by sensing data that is stored in memory cells that are included in the selected memory block MB1, based on the potential or current amount of the bit lines BL1 to BLm, which is changed according to a program state of the memory cells.

Figure 11:
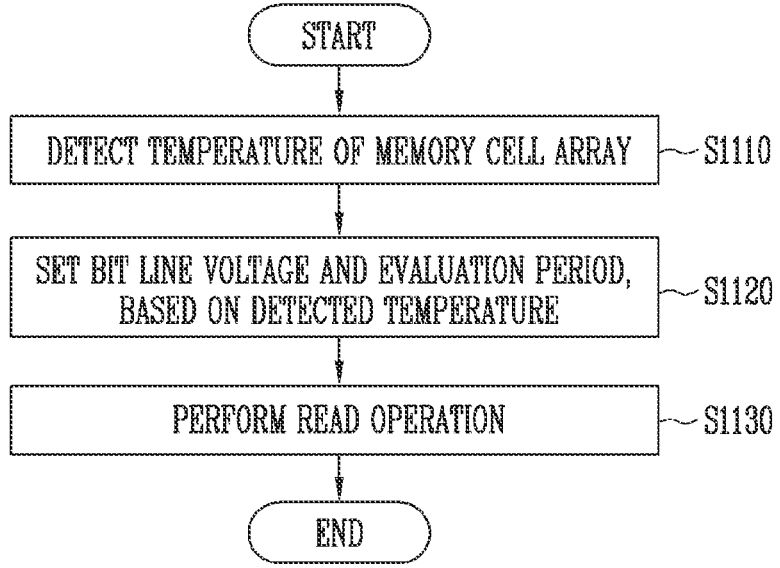
FIG. 11 is a flowchart illustrating another embodiment of the read operation method of the memory device shown in FIG. 2.

FIG. 11 is a flowchart illustrating another embodiment of the read operation method of the memory device shown in FIG. 2.

In step S1110, the temperature detection circuit 400 may generate a temperature detection signal temp_Det by detecting the temperature of the memory cell array 100 during a read operation and may output the temperature detection signal temp_Det to the control logic 300.

In step S1120, the control logic 300 may receive the temperature detection signal temp_Det from the temperature detection circuit 400, and sets the potential or current amount of a bit line voltage that is applied to the bit lines BL1 to BLm in a bit line precharge period during a read operation in response to the received temperature detection signal temp_Det. For example, the bit line voltage control circuit 320 of the temperature compensation circuit 310 may receive the temperature detection signal temp_Det from the temperature detection circuit 400 during the read operation and may set the potential or current amount of the bit line voltage that is applied to the bit lines BL1 to BLm in the precharge period of the bit lines BL1 to BLm in response to the received temperature detection signal temp_Det. For example, when the temperature of the memory cell array 100, which is detected from the temperature detection circuit 400, is lower than the set temperature, the bit line voltage control circuit 320 may set the temperature by increasing the potential or current amount of the bit line voltage that is applied to the bit lines BL1 to BLm in the precharge period of the bit lines BL1 to BLm to be higher than a reference value.

In addition, when the potential or current amount of the bit line voltage that is applied to the bit lines BL1 to BLm in the bit line precharge period is set higher than the reference value, the control logic 300 may set a length of an evaluation period to be longer than a reference time. The evaluation period of the page buffer group 130 may be a period for determining whether the potential or current amount of the bit lines BL1 to BLm is higher or lower than a trip voltage or a trip current amount during the read operation. For example, when the potential of the bit line voltage that is applied to the bit lines BL1 to BLm in the bit line precharge period is set higher than the reference value, the evaluation period of the page buffer group 130 may be set longer than the reference time.

In step S1130, the peripheral circuit 200 may perform the read operation on a selected memory block (e.g., MB1).

The read operation may include a bit line precharge period, a verify voltage apply period, and a data sensing period.

In the bit line precharge period, the page buffer group 130 may precharge the bit lines BL1 to BLm to a set level by applying the bit line voltage to the bit lines BL1 to BLm. A temperature of strings of the selected memory block (e.g., MB1) of the memory cell array 110 may be controlled by the bit line voltage. For example, the heating layer (116 shown in FIG. 6) that is included in the channel structure CH of the strings may generate heat based on the potential or current amount of the bit line voltage, and therefore, the temperature of the selected memory block MB1 may be controlled to match the set temperature.

In the verify voltage apply period, the voltage generating circuit 210 may generate and outputs a read voltage, and applies the read voltage that is generated by the voltage generating circuit 210 to a selected word line of the selected memory block MB1.

In the data sensing period, the page buffers PB1 to PBm 231 may determine whether the potential or current amount of the bit lines BL1 to BLm is higher or lower than the trip voltage or trip current amount during the set evaluation period, and sensing the determined result as read data.

As described above, when the temperature of the memory cell array 110 is lower than the set temperature during the read operation, the memory device may control the temperature of the selected memory block to match the set temperature by applying a signal of which potential or current amount is adjusted (the bit line voltage or the heating control signal) to the heating layer included in the channel structure of the strings or the heating layer that is disposed on the top/bottom of the memory block or within the memory block, and then may perform the read operation. Accordingly, the temperature of the selected memory block may be maintained as the set temperature during the read operation so that the reliability of the read operation can be improved.

Figure 12:
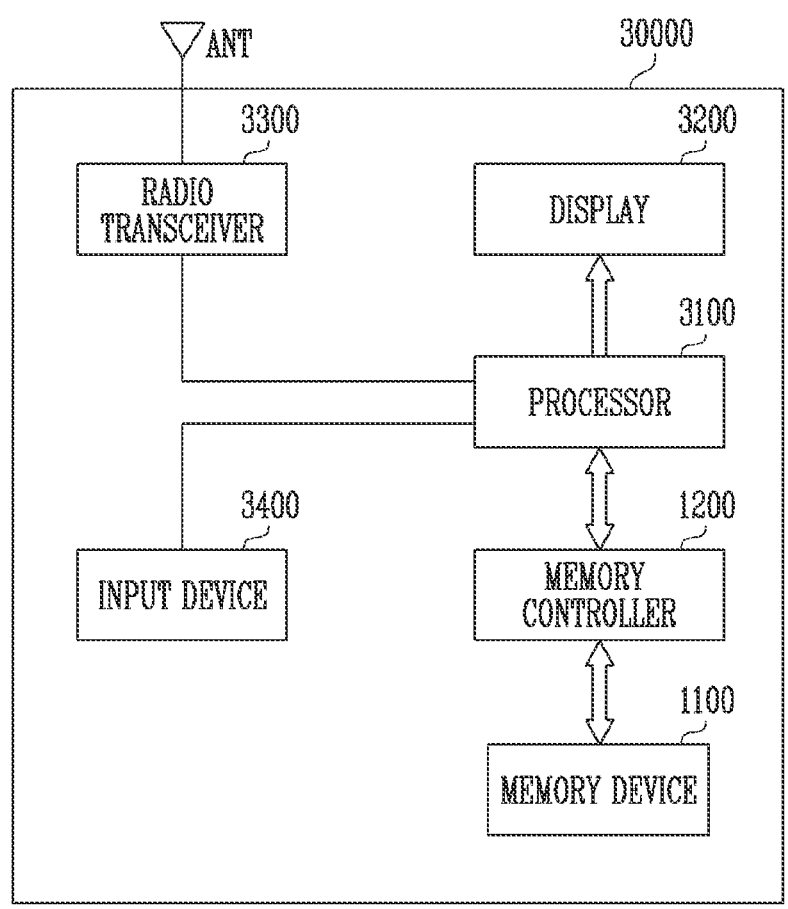
FIG. 12 is a diagram illustrating another embodiment of the memory system.

FIG. 12 is a diagram illustrating another embodiment of the memory system.

Referring to FIG. 12, the memory system 30000 may be implemented as a cellular phone, a smart phone, a tablet PC, a personal digital assistant (PDA), or a wireless communication device. The memory system 30000 may include a memory device 1100 and a memory controller 1200 capable of controlling an operation of the memory device 1100. The memory controller 1200 may control a data access operation of the memory device 1100, e.g., a program operation, an erase operation, a read operation, or the like, which is under the control of a processor 3100.

Data programmed in the memory device 1100 may be output through a display 3200, which is under the control of the memory controller 1200.

A radio transceiver 3300 may transmit/receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may transmit the signal processed by the processor 3100 to the memory device 1100. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device, such as a touch pad or a computer mount, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the memory device 1100 may be implemented as a part of the processor 3100, or be implemented as a chip separate from the processor 3100. Also, the memory controller 1200 may be implemented with the memory controller 1200 shown in FIG. 1, and the memory device 1100 may be implemented with the memory device 1100 shown in FIG. 2.

Figure 13:
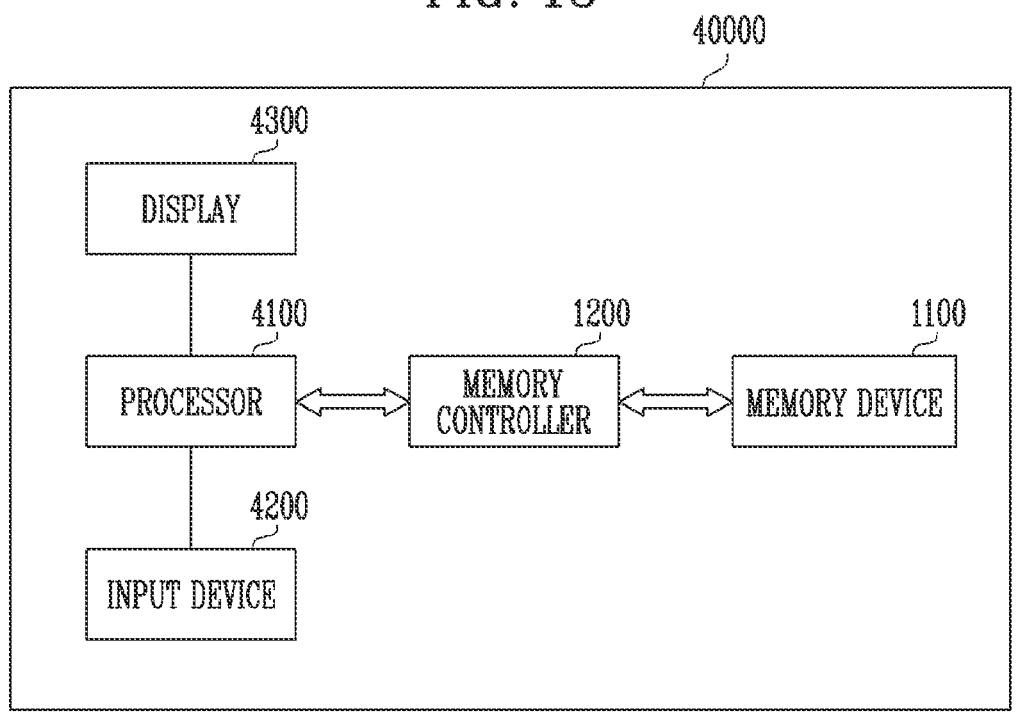
FIG. 13 is a diagram illustrating another embodiment of the memory system.

FIG. 13 is a diagram illustrating another embodiment of the memory system.

Referring to FIG. 13, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 1100 and a memory controller 1200 capable of controlling a data processing operation of the memory device 1100.

A processor 4100 may output data that is stored in the memory device 1100 through a display 4300 according to data input through an input device 4200. For example, the input device 4200 may be implemented as a pointing device, such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the memory device 1100 may be implemented as a part of the processor 4100, or be implemented as a chip separate from the processor 4100. Also, the memory controller 1200 may be implemented with the memory controller 1200 shown in FIG. 1, and the memory device 1100 may be implemented with the memory device 1100 shown in FIG. 2.

Figure 14:
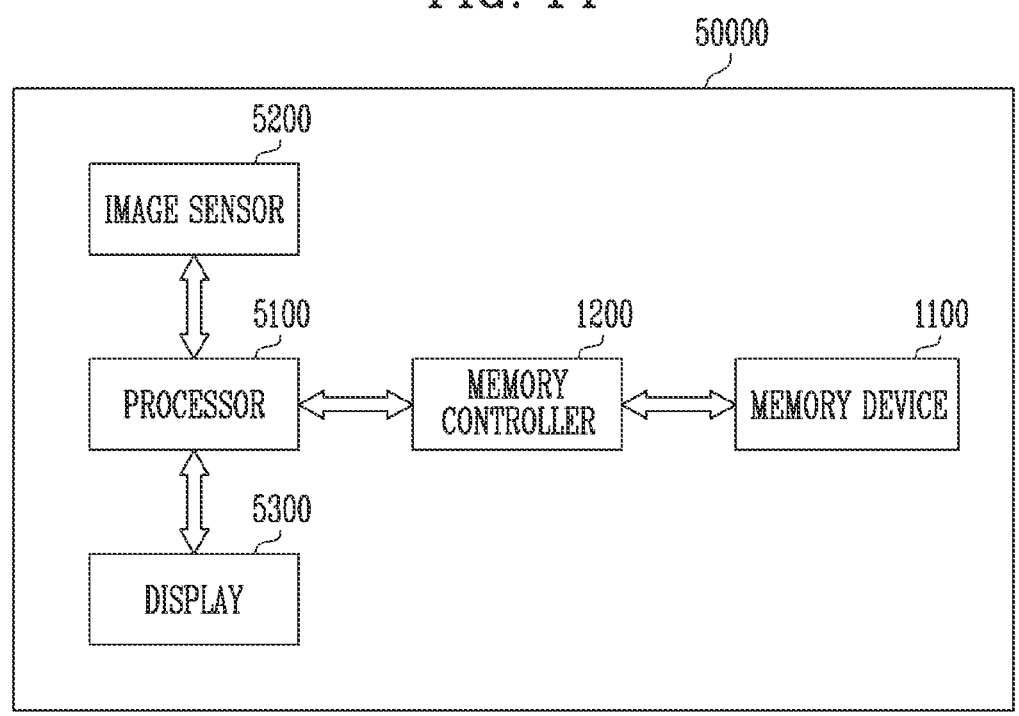
FIG. 14 is a diagramillustrating another embodiment of the memory system.

FIG. 14 is a diagram illustrating another embodiment of the memory system.

Referring to FIG. 14, the memory system 50000 may be implemented as an image processing device, e.g., a digital camera, a mobile terminal with a digital camera attached thereto, a smart phone with a digital camera attached thereto, or a tablet PC with a digital camera attached thereto.

The memory system 50000 may include a memory device 1100 and a memory controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the memory device 1100 through the memory controller 1200. In addition, data that is stored in the memory device 1100 may be output through the display 5300, which is under the control of the processor 5100 or the memory controller 1200.

In some embodiments, the memory controller 1200 capable of controlling an operation of the memory device 1100 may be implemented as a part of the processor 5100, or be implemented as a chip separate from the processor 5100. Also, the memory controller 1200 may be implemented with the memory controller 1200 shown in FIG. 1, and the memory device 1100 may be implemented with the memory device 1100 shown in FIG. 2.

Figure 15:
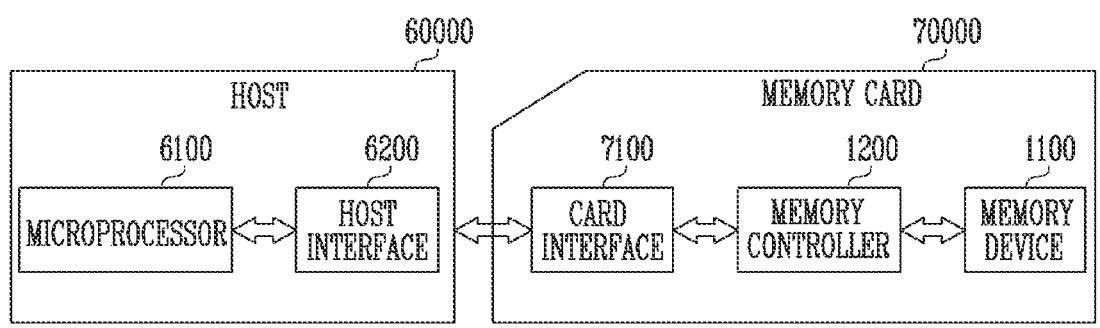
FIG. 15 is a diagram illustrating another embodiment of the memory system.

FIG. 15 is a diagram illustrating another embodiment of the memory system.

Referring to FIG. 15, the memory system 70000 may be implemented as a memory card or a smart card. The memory system 70000 may include a memory device 1100, a memory controller 1200, and a card interface 7100.

The memory controller 1200 may control data exchange between the memory device 1100 and the card interface 7100. In some embodiments, the card interface 7100 may be a secure digital (SD) card interface or a multi-media card (MMC) interface, but the present disclosure is not limited thereto. Also, the memory controller 1200 may be implemented with the memory controller 1200 shown in FIG. 1, and the memory device 1100 may be implemented with the memory device 1100 shown in FIG. 2.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is connected to a host interface 6200 of the host 60000, such as a PC, a tablet PC, a digital camera, a digital audio player, a cellular phone, console video game hardware, or a digital set-top box, the host interface 6200 may perform data communication with the memory device 1100 through the card interface 7100 and the memory controller 1200, which is under the control of a microprocessor 6100.

In accordance with the present disclosure, a temperature of a memory block is detected, and the temperature of the memory block is compensated according to the detected result, so that the reliability of the memory device can be improved.

While the present disclosure has been shown and described with reference to certain exernplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification, Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
   a memory cell array including a plurality of memory blocks, each including a plurality of strings, wherein the plurality of memory blocks are controlled to have a set temperature;
   a peripheral circuit configured to perform a read operation on a selected memory block among the plurality of memory blocks;
   a temperature detection circuit configured to detect a temperature of the memory cell array and generate a temperature detection signal based on the temperature of the memory cell array; and
   a control logic configured to control the peripheral circuit during the read operation and configured to generate a heating control signal that may control the selected memory block to have the set temperature in response to the temperature detection signal.

2. The memory device of claim 1, wherein each of the plurality of strings has a channel structure including a heating layer, a channel layer, a tunnel insulating layer, and a charge storage layer.

3. The memory device of claim 2, wherein the heating layer controls the selected memory block to have the set temperature by generating heat in response to the heating control signal.

4. The memory device of claim 3, wherein the heating layer is a metal alloy layer, a doped silicon layer; a doped germanium layer, or a doped carbon layer.

5. The memory device of claim 1, wherein the memory cell array includes a heating layer that is disposed on the top or the bottom of each of the plurality of memory blocks or within each of the plurality of memory blocks.

6. The memory device of claim 1, wherein the read operation includes a temperature compensation period and a data sensing period,
   wherein the selected memory block is controlled to have the set temperature in response to the heating control signal in the temperature compensation period, and
   wherein the peripheral circuit reads data that is stored in the selected memory block in the data sensing period after the temperature compensation period is ended.

7. A memory device comprising:
   a memory cell array including a plurality of memory blocks each including a plurality of strings, wherein the plurality of memory blocks are controlled to have a set temperature in response to a bit line voltage;
   a peripheral circuit configured to perform a read operation on a selected memory block among the plurality of memory blocks;
   a temperature detection circuit configured to detect a temperature of the memory cell array and generate a temperature detection signal based on the temperature of the memory cell array; and
   a control logic configured to control the peripheral circuit during the read operation and configured to set a potential or current amount of the bit line voltage to control the selected memory block to have the set temperature in response to the temperature detection signal.

8. The memory device of claim 7, wherein each of the plurality of strings has a channel structure including a heating layer, a channel layer, a tunnel insulating layer, and a charge storage layer.

9. The memory device of claim 8, wherein the heating layer and the channel layer are connected to any one of a plurality of bit lines.

10. The memory device of claim 8, wherein the heating layer controls the selected memory block to have the set temperature by generating heat in response to the bit line voltage.

11. The memory device of claim 8, wherein the heating layer is a metal ahoy layer, a doped silicon layer, a doped germanium layer, or a doped carbon layer.

12. The memory device of claim 7, wherein the read operation includes a temperature compensation period and a data sensing period,
   wherein the selected memory block is controlled to have the set temperature in response to the bit line voltage in the temperature compensation period, and wherein the peripheral circuit reads data that is stored in the selected memory block in the data sensing period after the temperature compensation period is ended.

13. The memory device of claim 7, wherein the read operation includes a bit line precharge period and a data sensing period,
wherein the selected memory block is controlled to have the set temperature in response to the bit line voltage in the bit line precharge period, and
wherein the peripheral circuit reads data that is stored in the selected memory block in the data sensing period after the bit line precharge period is ended.

14. A method for operating a memory device, the method comprising
providing a memory cell array including a plurality of memory blocks, each with a heating layer;
detecting a temperature of the memory cell array by using a temperature detection circuit that is disposed adjacent to the memory cell array;
generating a heating control signal that is applied to the heating layer of a selected memory block among the plurality of memory blocks based on the detected temperature of the memory cell array;
controlling the selected memory block to have a set temperature or higher in response to the heating control signal; and
performing a data sensing operation on the selected memory block.

15. The method of claim 14, wherein each of the plurality of memory blocks includes a plurality of strings, and
wherein each of the plurality of strings has a channel structure including a heating layer, a channel layer, a tunnel insulating layer, and a charge storage layer.

16. The method of claim 14, wherein the heating layer generates heat based on a potential or current amount of the heating control signal.

17. The method of claim 14, wherein the heating layer is connected to any one of a plurality of bit lines of the memory cell array.

18. A method for operating a memory device, the method comprising:
providing a memory cell array including a plurality of memory blocks, each with a heating layer;
detecting a temperature of the memory cell array by using a temperature detection circuit that is disposed adjacent to the memory cell array;
setting a potential or current amount of a bit line voltage that is applied to bit lines of a selected memory block among the plurality of memory blocks based on the detected temperature of the memory cell array;
controlling the selected memory block to have a set temperature or higher by applying the bit line voltage to the bit lines of the selected memory block in a bit line precharge period; and
performing a data sensing operation on the selected memory block.

19. The method of claim 18, wherein each of the plurality of memory blocks includes a plurality of strings,
where each of the plurality of strings has a channel structure including a heating layer, a channel layer, a tunnel insulating layer, and a charge storage layer, and
wherein the heating layer generates heat, based on the potential or current amount of the bit line voltage.

20. The method of claim 18, wherein, in the setting of the potential or current amount of the bit line voltage, a length of an evaluation period of a data sensing period is set based on the set potential or current amount of the bit line voltage.

* * * * *